United States Patent
Yen et al.

(10) Patent No.: US 7,307,863 B2
(45) Date of Patent: Dec. 11, 2007

(54) PROGRAMMABLE STRENGTH OUTPUT BUFFER FOR RDIMM ADDRESS REGISTER

(75) Inventors: Jeffrey C. Yen, Camarillo, CA (US); Nikhil K. Srivastava, Woodland Hills, CA (US); Gopal Raghavan, Thousand Oaks, CA (US)

(73) Assignee: Inphi Corporation, Westlake Village, CA (US)

( * ) Notice: Subject to any disclaimer, the term of this patent is extended or adjusted under 35 U.S.C. 154(b) by 242 days.

(21) Appl. No.: 11/195,910

(22) Filed: Aug. 2, 2005

(65) Prior Publication Data

US 2007/0030752 A1 Feb. 8, 2007

(51) Int. Cl.
*G11C 7/00* (2006.01)
(52) U.S. Cl. .................. 365/63; 365/189.05
(58) Field of Classification Search ........... 365/63, 365/189.05
See application file for complete search history.

(56) References Cited

U.S. PATENT DOCUMENTS

| | | | |
|---|---|---|---|
| 4,707,620 A | 11/1987 | Sullivan et al. | 307/270 |
| 5,519,338 A | 5/1996 | Campbell et al. | 326/27 |
| 5,632,019 A | 5/1997 | Masiewicz | 395/250 |
| 5,958,026 A | 9/1999 | Goetting et al. | 710/52 |
| 6,684,263 B2 | 1/2004 | Horowitz et al. | 710/8 |
| 2004/0243753 A1 | 12/2004 | Horowitz et al. | |
| 2005/0060601 A1 | 3/2005 | Gomm | |
| 2005/0259504 A1* | 11/2005 | Murtugh et al. | 365/233 |
| 2006/0280004 A1* | 12/2006 | Washburn et al. | 365/189.09 |
| 2007/0111606 A1* | 5/2007 | Goodwin | 439/633 |

FOREIGN PATENT DOCUMENTS

CA 1273063 8/1990

OTHER PUBLICATIONS

JEDEC Standard, Definition of the SSTU32864 1.8-V Configurable Registered Buffer for DDR2 RDIMM Applications, JEDEC Solid State Technology Association, JESD82-7A, Oct. 2004, pp. 1-16.
JEDEC Standard, Definition of the SSTU32866 1.8-V Configurable Registered Buffer with Parity Test for DDR2 RDIMM Applications, JEDEC Solid State Technology Association, JESD82-10, Nov. 2004, pp. 1-32.
JEDEC Standard No. 21C, PC2-3200/PC2-4300 Registered DIMM Design Specification, Apr. 2004, pp. 1-67.
Dabral, S. and Maloney, T. J., *Basic ESD and I/O Design*, New York, John Wiley & Sons, Inc., pp. 162-165, 1998.

(Continued)

*Primary Examiner*—Michael T Tran
(74) *Attorney, Agent, or Firm*—Koppel, Patrick, Heybl & Dawson

(57) ABSTRACT

A programmable strength output buffer intended for use within the address register of a memory module such as a registered DIMM (RDIMM). The output signals of an array of such buffers drive respective output lines that are connected to the address or control pins of several RAM chips. The programmable buffers vary the strength of at least some of the output signals in response to a configuration control signal, such that the output signals can be optimized for the loads to which they will be connected.

16 Claims, 5 Drawing Sheets

OTHER PUBLICATIONS

"DDR SDRAM Specification, Version 1.31," Samsung Electronics, Nov. 3, 2001, pp. 1-55.

"DDR2 Registered Memory Modules, Data Sheet, Rev. 0.85," Infineon, Apr. 200, pp. 1-33.

"Spartan-II 2.5V FPGA Family: Functional Description, DS001-2 (v2.2)". Xilinx, Sep. 3, 2003, pp. 1-45.

"Interfacing the QDR with Altora APEX20KE," Cypress Semiconductor Corp., Mar. 12, 2001, 7 pps.

"Interfacing the QDR with Xilinx Spartan-II FPGA," Cypress Semiconductor Corp., Feb. 21, 2000, 4 pps.

"EIA/JEDEC Standard," EIA/JESD8-7, Electronics Industries Association, Feb. 1977, 7 pps.

"CY7C1316V18, 18-Mb DDR-II SRAM Two-word Burst Architecture," Cypress Semiconductor Corp., Jul. 31, 2002, pp. 1-24.

"Quad-Data-Rate SRAM Subsystems Maximize System Performance," Electronic Design, Feb. 7, 2000, 6 pps.

"TI is the First Supplier with Logic Register Components for Evaluation in DDR-II DIMM Designs," Embedded Star, Sep. 26, 2002, pp. 1-2.

"Digitally Adjustable Resistors in CMOS for High-Performance Applications," IEEE Journal of Solid-State Circuits, vol. 27, No. 8, Aug. 1992, pp. 1176-1185.

"PC133 SDRAM Registered DIMM, Design Specification, Revision 1.4," JEDEC Standard No. 21-C, Feb. 2002, 74 pps.

"Output Buffer Impedance Control and Noise Reduction Using a Speed-Locked Loop," International Solid-State Circuits Conference, 2004, 9 pps.

\* cited by examiner

PROGRAMMABLE STRENGTH OUTPUT BUFFER FOR RDIMM ADDRESS REGISTER

BACKGROUND OF THE INVENTION

1. Field of the Invention

This invention relates to the field of memory modules, and particularly to the output buffers of Registered Dual-Inline Memory Module (RDIMM) address registers.

2. Description of the Related Art

Dual-Inline Memory Modules (DIMMs) are the industry-standard platform on which random access memory (RAM) is provided for digital computers. Each DIMM is a printed-circuit board that contains a number of individual RAM integrated circuits (ICs) or "chips." One variety of DIMM, called a registered DIMM (RDIMM), contains an address register that acts as an electrical buffer, distributing received memory address bits to each of the RDIMM RAM chips. RDIMMs are provided in a variety of configurations, each of which is referred to as a "raw card". Each raw card type, as well as RAM chip and address register component, has an associated set of specifications, promulgated by the industry-supported JEDEC Solid State Technology Association international standards body. A multitude of raw card configurations exist due to the need to support different RDIMM memory capacities, as well as to support RAM chips with different internal designs, as driven by proprietary expedients that may be unique to a RAM manufacturer or manufacturing process.

One JEDEC specification details an address register that may be used on several different raw cards. One raw card type contains 9 RAM chips whose address pins are wired together in a network spanning the physical width of the RDIMM; an exemplary embodiment is shown in FIG. 1a. The other raw card types contain 18 RAM chips that are subdivided according to their placement on the RDIMM. Depending upon the logical functionality of each address bit, the address pins of the RAM chips may be wired together in groups of 4, 5, 8, or 10, in wiring networks spanning only half the physical width of the RDIMM; an exemplary embodiment of this RDIMM configuration is shown in FIG. 1b.

To support these different raw card configurations, the address register contains an array of 28 output buffers and 28 corresponding output pins that may be organized in one of two ways. A configuration control bit applied to the address register selects between the two array deployments. As shown in FIG. 1a, the array may be organized as a 1:1 fanout array, in which 25 address bits applied as inputs are distributed to 25 of the 28 output buffers (only one buffer is shown) in 1:1 correspondence. This arrangement is specified for the raw card configuration of 9 DRAM chips wired together. Alternately, as shown in FIG. 1b, the array may be organized as a 1:2 fanout array. In this case, the array is split into two sub-arrays of 14 output buffers, denoted "A" and "B" (only two buffers are shown), with 14 address bits applied as inputs fanning out to 28 output pins through both the A and B sub-arrays. This arrangement is specified for any of the raw cards containing 18 DRAM chips, in order to support the divided wiring arrangement of the 18 chips. In order to support the 25-28 address bits required for JEDEC-standard DDR2 RDIMMs, two registers are used on an RDIMM when using registers in 1:2 fanout mode. A second configuration control bit is used to distinguish the two registers according to the specific DRAMs to which they are wired.

Conventionally, the output buffers have a unique fixed output "strength": each buffer produces a characteristic output current and transient slew rate when driving a standardized electrical load. The output strength is engineered ad hoc for either a specific raw card configuration, or an electrical approximation that represents the mathematical average of relevant electrical dimensions of all the possible raw card configurations for which the register is intended. Address register output signal integrity degrades when the number of DRAM input pins, and/or the dimension of the wire network driven by an output buffer, differs from that for which it was designed. Signal integrity degradation can take the form of ringing, overshoot, and/or pulse reflections, all of which reduce system reliability, and impose limits on operating speed as the frequency-dependence of the actual output load amplifies the electrical loading at higher operating speed.

SUMMARY OF THE INVENTION

A programmable strength output buffer is presented which overcomes the reduced system reliability and operating speed limits noted above, by enabling the strength of the output buffers of an RDIMM address register to be varied as needed for a particular raw card application.

The present programmable strength output buffer is intended for use with memory modules that include a signal repeater which drives output lines, the loading of which depends on the particular module configuration. A primary application of the invention is an RDIMM having an address register which includes an array of the present programmable strength output buffers, with the output signals provided by the buffers driving respective output lines that are connected to the address or control pins of several RAM chips. The register is arranged to receive a configuration control signal which, in one embodiment, indicates the type of raw card on which the address register resides, and varies the strength of at least some of the register's output signals in response to the configuration control signal. In this way, the strength of the output buffer signals can be optimized for the loads to which they will be connected on the indicated raw card type, thereby reducing the signal integrity degradations that might otherwise occur.

The configuration control signal may take a variety of forms, depending upon the degree of flexibility of configuration and configuration programmability desired. Conformant to JEDEC specification, there may be two configuration control bits hardwired to logic levels on the RDIMM; alternately, there may be a greater number of configuration control bits hardwired on the RDIMM, making use of redundant register pins to complete the connection to the output buffers. Also, any number of configuration control bits may be stored (and also re-programmed) in a re-writable memory storage device, such as an EEPROM residing on the RDIMM, using the JEDEC-specified pins as well as redundant register pins as necessary. Further, any number of configuration control bits may be driven by the memory subsystem, linking to the address register through JEDEC-specified and redundant register pins and through redundant lines on the connector between the RDIMM and memory subsystem.

An output buffer in accordance with the present invention could be arranged such that the strength of each of the register's output buffers is programmed to be equal in response to the configuration control signal. Alternately, different subsets of output buffers could be set to respective strengths in response to the configuration control signal, or each output buffer could be individually programmed to a desired strength in response to the configuration control signal.

Further features and advantages of the invention will be apparent to those skilled in the art from the following detailed description, taken together with the accompanying drawings.

DETAILED DESCRIPTION OF THE INVENTION

The present programmable strength output buffer is generally applicable for use with memory modules that include a signal repeater which drives output lines, the loading of which depends on the particular module configuration. The signal repeater contains an array of the present programmable strength output buffers, each of which provides a respective output signal. Each programmable buffer is arranged to receive a configuration control signal, and to vary the strength of its output signal in response to the configuration control signal.

A primary application of the present invention is an RDIMM having an address register which includes a plurality of the present programmable strength output buffers, with the output signals provided by the buffers driving respective output lines that are connected to the address or control pins of several RAM chips. For purposes of illustration, this application is described throughout, though the invention is in no way limited to use with RDIMMs.

Figure 1A:
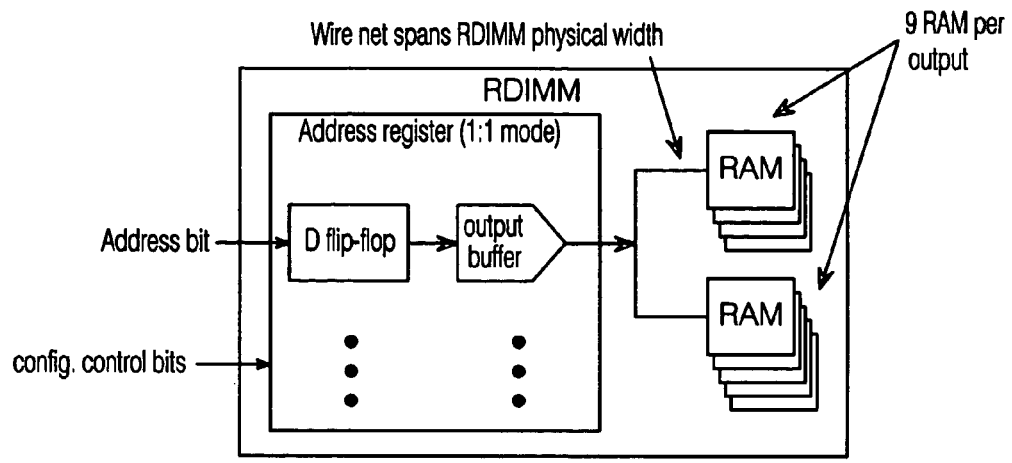
FIGS. 1a and 1b depict known RDIMM configurations.
Figure 1B:
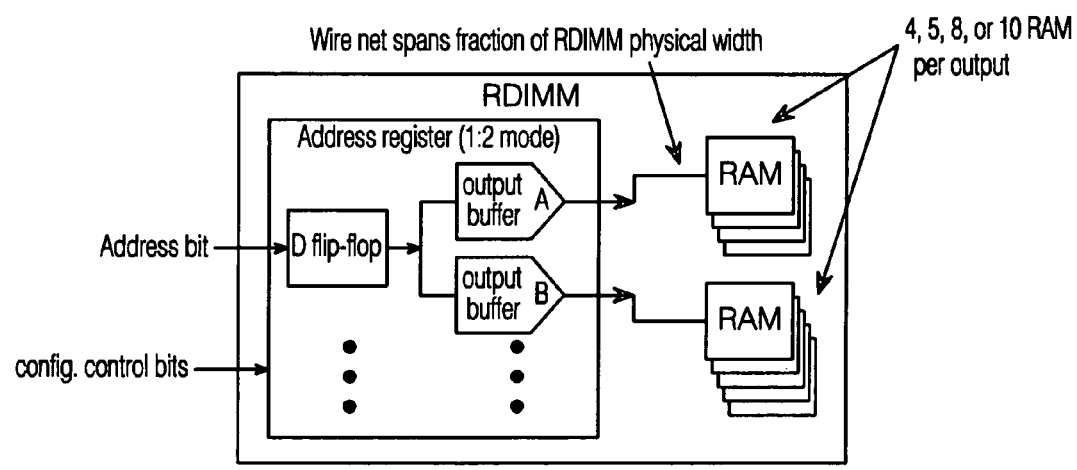
Figure 2:
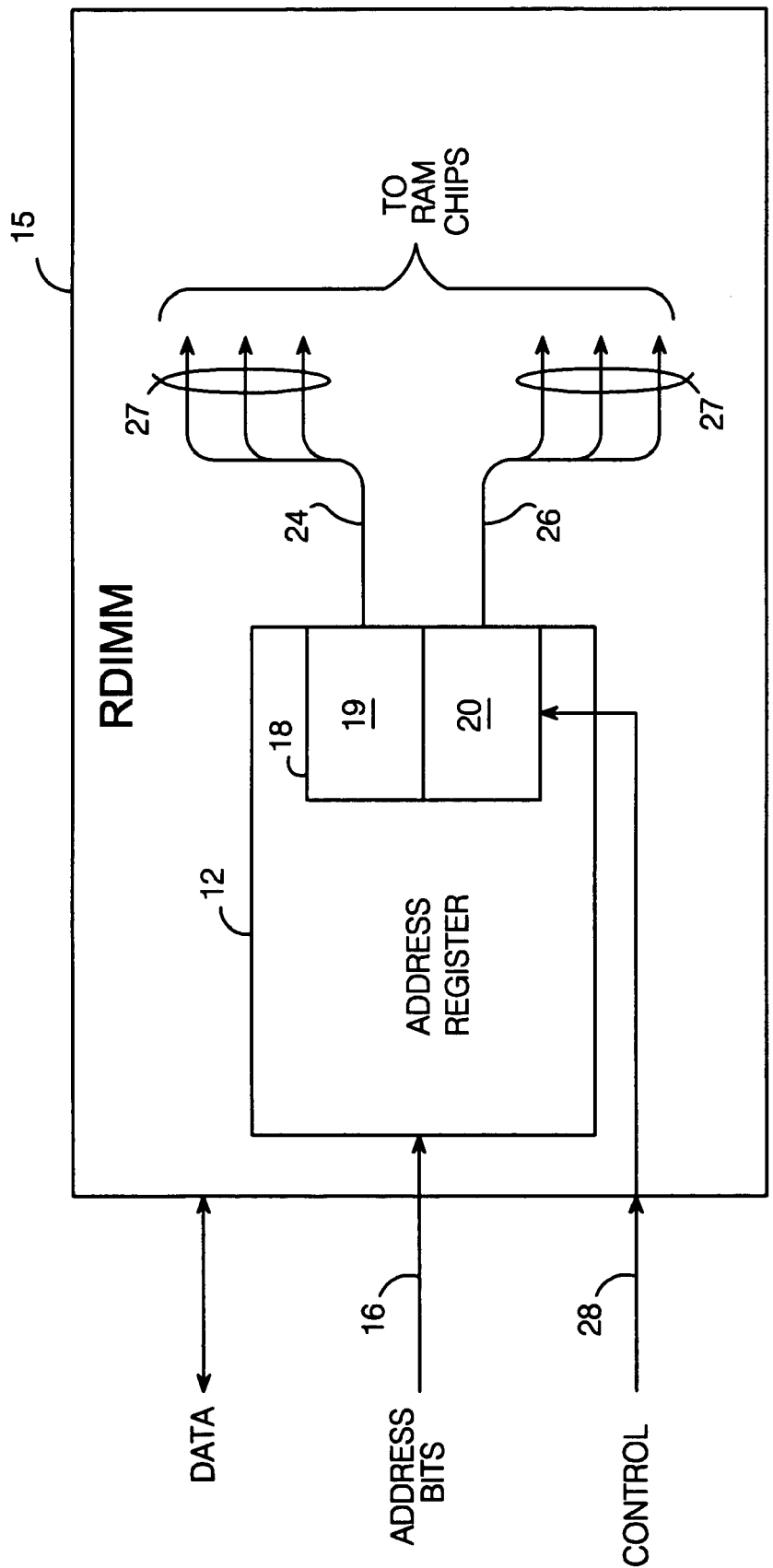
FIG. 2 is a block diagram illustrating the basic principles of a programmable strength output buffer per the present invention.

The basic principles of a programmable strength output buffer in accordance with the present invention are illustrated in FIG. 2. Though the invention is applicable to memory modules in general (as discussed above), FIG. 2 depicts the invention in an address register 12 contained within an RDIMM raw card 15. Address register 12 conveys a number of incoming address bits 16 to each of the RDIMM's RAM chips (not shown) via an array of programmable strength output buffers 18; two buffers (19, 20) are shown in FIG. 2, though as noted above, an RDIMM's address register typically contains an array of 28 output buffers.

Each output buffer drives a respective output line (24,26) which is connected to an address or control pin on several RAM chips through a complex wire network 27. As described above, the loading, comprised of several RAM chips and a complex wire network which may span the full physical width of the RDIMM, or a much smaller fraction thereof, experienced by each output signal can vary depending on the raw card type. Since the loading varies significantly, with broad variations in number of connected RAM chips and dimension of the wire network, an output signal which is not tailored for the specific load may exhibit unwanted ringing, overshoot, and/or reflections which degrade the address register output signal, reducing system reliability or imposing limits on output signal frequency.

The invention overcomes these problems by making at least some of the output buffers of array 18 programmable. Each programmable strength output buffer is arranged to receive a configuration control signal, and to vary the strength of at least some dimension of its output drive strength in response to the configuration control signal. In this way, the characteristics of the address register's output signals can be varied as needed to properly accommodate the loading presented by the raw card on which the address register is installed, thereby minimizing signal degradation.

The output signal of each buffer has an associated output current which drives its respective output line. As used herein, varying the "strength" of an output buffer comprises varying the magnitude and/or the transient slew rate of its output current.

The present output buffer is responsive to a configuration control signal. As noted above, the configuration control signal may take a variety of forms, depending upon the degree of flexibility of configuration and configuration programmability desired for a particular application; the configuration control signal is represented as a signal 28 in FIG. 2. Conformant to JEDEC specification, the address register has two configuration control bits which may be hardwired to logic levels on the RDIMM; alternately, there may be a greater number of configuration control bits hardwired on the RDIMM, making use of redundant register pins to complete the connection to the output buffers. Also, any number of configuration control bits may be stored (and also re-programmed) in a re-writable memory storage device, such as an EEPROM residing on the RDIMM, using the JEDEC-specified pins as well as redundant register pins as necessary. Further, any number of configuration control bits may be driven by the memory subsystem, linking to the address register through JEDEC-specified and redundant register pins and through redundant lines on the connector between the RDIMM and memory subsystem. A programmable output buffer array 18 in accordance with the present invention can be arranged to receive the configuration control signal and to vary the strengths of one or more output buffers in response, to accommodate the loading presented by the indicated card's configuration of RAM chips and wiring network.

An array of programmable output buffers as described herein could be arranged such that the strength of each of the array's output buffers is programmed to the same value in response to the configuration control signal. This might be sufficient if each output signal were loaded identically.

Alternately, the buffers could be arranged such that the strength of each output buffer is individually programmed to a desired strength in response to the configuration control signal. Here, the configuration control signal would need to convey information sufficient to adjust each output buffer to the desired strength.

In yet another configuration, the output buffer array could be arranged such that subsets of output buffers are programmed to respective strengths in response to the configuration control signal. For example, in some applications, some output buffers may drive respective address lines, while other output buffers drive control lines. A control line may be lightly loaded in comparison with an address line. To accommodate this condition, the output buffers driving control lines could be set to one strength value, and the output buffers driving address lines could be set to a different strength value.

When so arranged, the programmable output buffers enable the address register on which the buffers reside to be used on a number of different raw cards, as well as with non-standard raw card designs. Each of these possible uses may present different output load characteristics, which can now be accommodated as needed to avoid the signal degradation that might otherwise occur.

Figure 3:
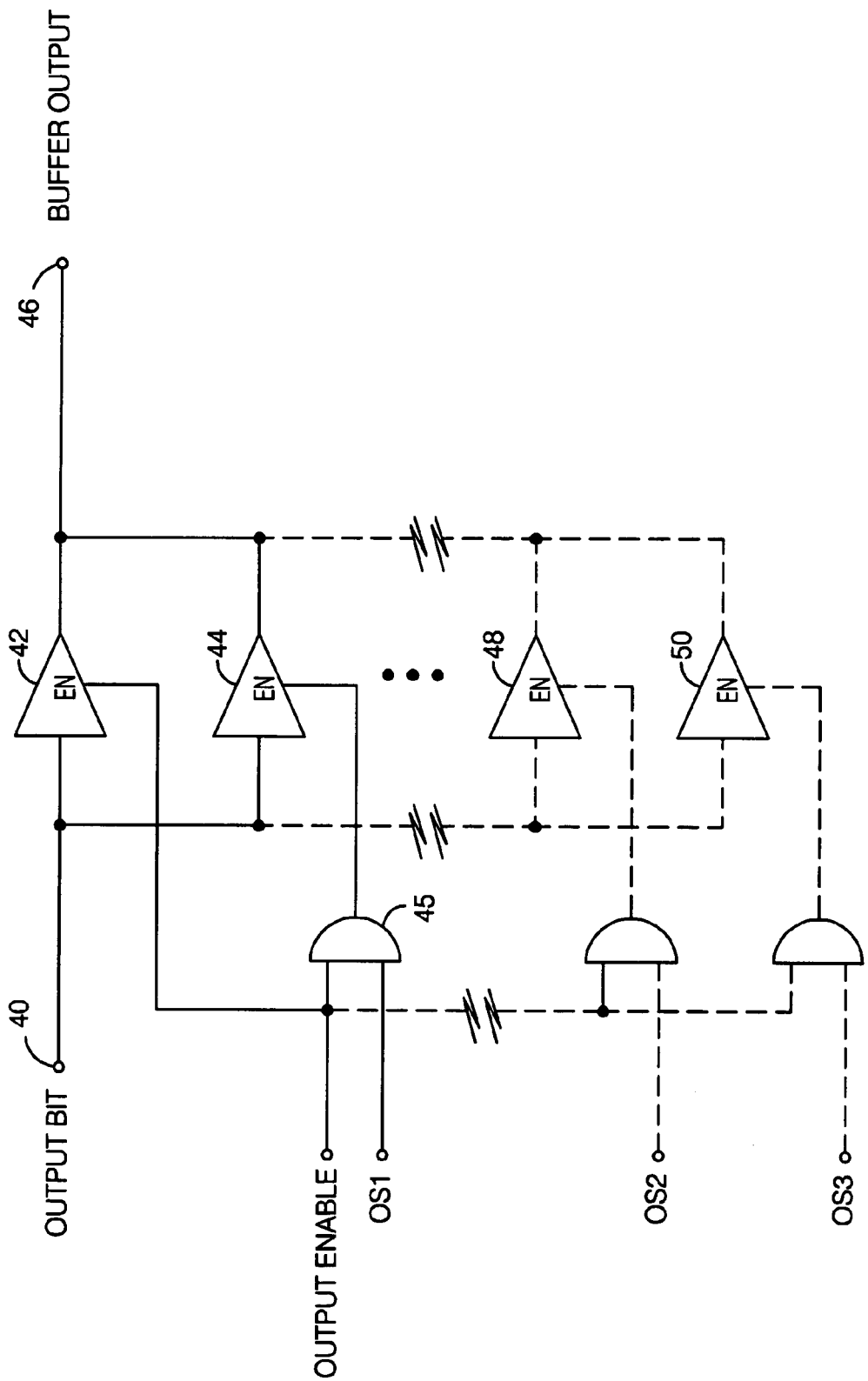
FIG. 3 is a block/schematic diagram of a programmable strength output buffer per the present invention.

An exemplary embodiment of an individual programmable output buffer, responsible for generating one output signal on the RDIMM, is shown in FIG. 3. Assuming that the output buffer is arrayed in the address register such that each of the address register output signals is programmable, circuitry such as that shown in FIG. 3 would be replicated n times for each of the address register's n output signals.

An address register output bit 40 to be provided as an output signal to one or more RAM chips is provided to the inputs of a first output driver 42 and a second output driver 44. The outputs of drivers 42 and 44 are connected together to provide the buffer's final, programmed output signal 46. An output strength control bit OS1 for setting the output strength of output signal 46 is derived from a configuration control signal having one of the forms discussed above; e.g., as configuration control bits hardwired to logic levels on the RDIMM, or as a signal value which has been electrically programmed into a memory storage device.

The output buffer would also typically receive an "output enable" signal. This signal is commonly employed in general memory module applications because the buffer's output signal may be driving a bi-directional bus, in which case the driver must support a non-active, high-impedance output state; or a lower-power "sleep" state; or when another driver on the same signal bus is active.

In the RDIMM address register as defined by JEDEC, output enable is not used, and is instead treated as a perpetual logic high signal.

The "output enable" signal is provided to the "enable" input of driver 42, and the "output enable" and OS1 signals are logically combined—here, with an AND gate 45—to provide the enable signal to driver 44. In operation, when control bit OS1 is low, the strength of output signal 46 is determined entirely by driver 42. However, when OS1 is high, output signal 46 is provided by both drivers 42 and 44. Thus, for this example, output strength control bit OS1 sets buffer output signal 46 to one of two possible output strengths.

Additional resolution for setting the buffer's output strength is obtained by providing additional drivers, such as drivers 48 and 50 shown in FIG. 3. Each additional driver is enabled in the same manner as driver 44; i.e., with an enable signal determined by "output enable" and the state of an output strength control bit (OS2, OS3). The strengths provided by the various drivers can be arranged in any number of ways. For example, the strengths of the driver outputs could all be equal, or they could be weighted by scaling corresponding to the control bit weighting—such as binary-weighted or thermometer code-weighted. For instance, if a 2:1 dynamic range is desired for the output buffer signal, with 4 possible settings (e.g., 1.0, 1.33, 1.67, and 2.0 times minimum strength), two base-2 power-weighted output strength control bits could be employed, along with three drivers having output strength ratios of 3:2:1. For example, the ratio of the output strengths of driver 42 to driver 44 would be 3:2, and the ratio of the output strengths of driver 44 to driver 48 would be 2:1. The MSB (OS1) would control the enabling of driver 44, and the LSB (OS2) would control the enabling of driver 48. The arrangement shown in FIG. 3 would be replicated for each of the address register's output signals.

As noted above, an address register per the present invention could be arranged such that the strengths of each of the register's output buffers are programmed to the same strength in response to the control signal. For this case, the output strength control bits provided to each programmable strength output buffer in the address register would be the same.

Alternately, the address register could be arranged such that the strength of each output buffer is individually programmed. The address register would be arranged to provide a unique set of output strength control bits to each output buffer, as needed to achieve the desired output drive strength for each output buffer.

The output buffer could also be arranged such that subsets of output buffers are programmed to respective strengths in response to the configuration control signal. Here, the individual output buffers making up each subset would receive the same output strength control bits, with different subsets receiving different configuration control bits.

Figure 4:
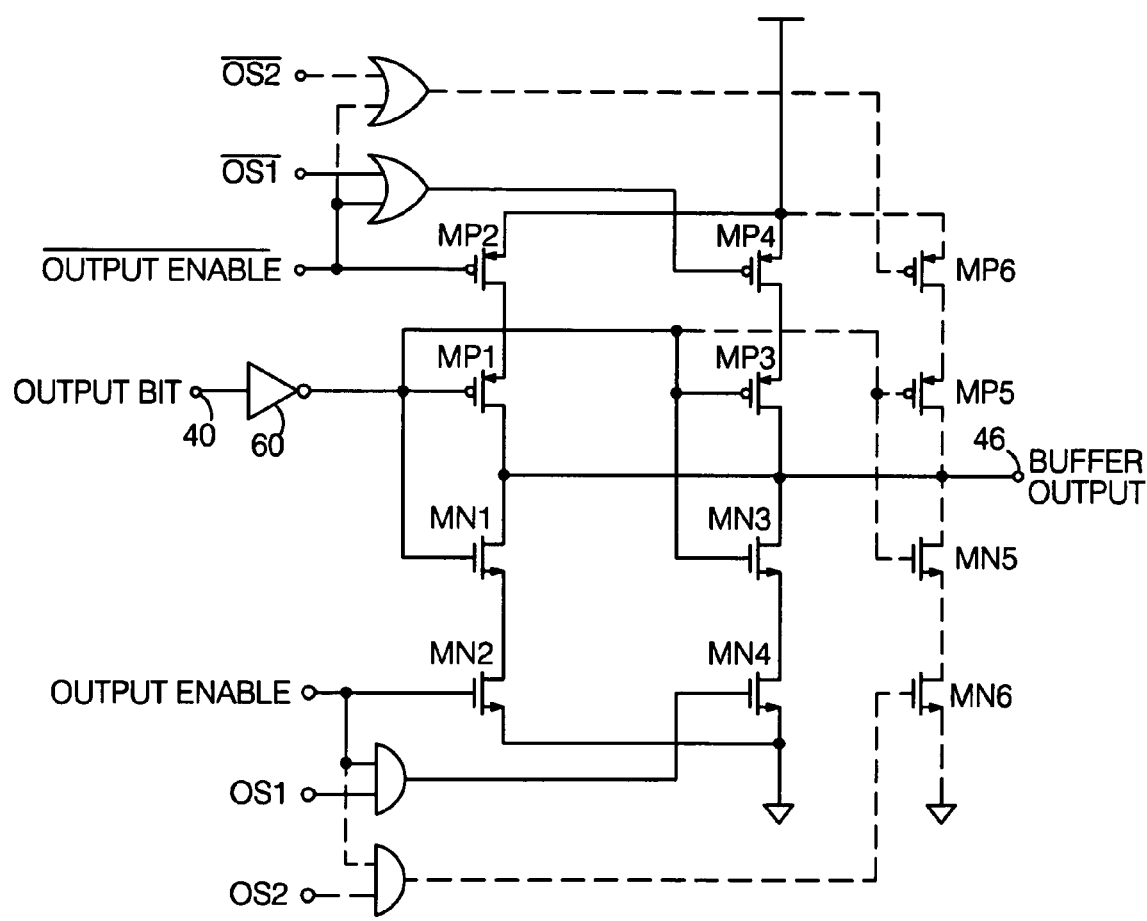
FIG. 4 is a schematic diagram of a programmable strength output buffer per the present invention.

One possible implementation of a programmable strength output buffer is shown in FIG. 4. The output bit 40 to be provided as an output signal is applied to the input of an inverter 60, the output of which drives a PMOS FET MP1 and an NMOS FET MN1. When "output enable" is high, FETs MP2 and MN2, which are connected in series with MP1 and MN1, respectively, are turned on. When output bit 40 is high, MP1 is turned on, and MP1 and MP2 conduct current to make buffer output signal 46 high. When output bit 40 is low, MN1 is turned on, and MN1 and MN2 conduct current to pull buffer output signal 46 low.

To vary the strength of the output signal, the circuit includes a second branch of FETs which are activated when OS1 is high. The output of inverter 60 is applied to a PMOS FET MP3 and an NMOS FET MN3. When "output enable" and OS1 are high, FETs MP4 and MN4, which are connected in series with MP3 and MN3, respectively, are turned on. When output bit 40 is high, MP3 is turned on, and MP3 and MP4 conduct current to buffer output signal 46 in parallel with MP1 and MP2, thereby increasing the positive output current of signal 46. When output bit 40 is low, MN3 is turned on, and MN3 and MN4 conduct current to buffer output signal 46 low in parallel with MN1 and MN2, thereby increasing the negative output current of signal 46.

The programmable strength output buffer could be implemented in many different ways, and arranged to vary a number of different output signal parameters in addition to or instead of output current magnitude. For example, the circuitry could be arranged to vary the slew rate of the signal's output current in response to one or more output strength control bits.

As discussed above, the arrangement shown in FIG. 4 would be replicated for each of the address register output bits. Additional resolution for the output strength of signal 46 is obtained by providing additional drivers: in FIG. 4, this could be achieved with another set of FETs MP5, MP6, MN5, MN6, connected to source or sink current for output signal 46 in response to a control bit OS2. The device sizes of the circuit's FETs could be sized as needed to provide a desired scaling or weighting.

Note that, though the schematics contained herein depict the use of field-effect transistors (FETs), bipolar transistors or other state-of-the-art current switching integrated circuit devices could also be used.

Figure 5:
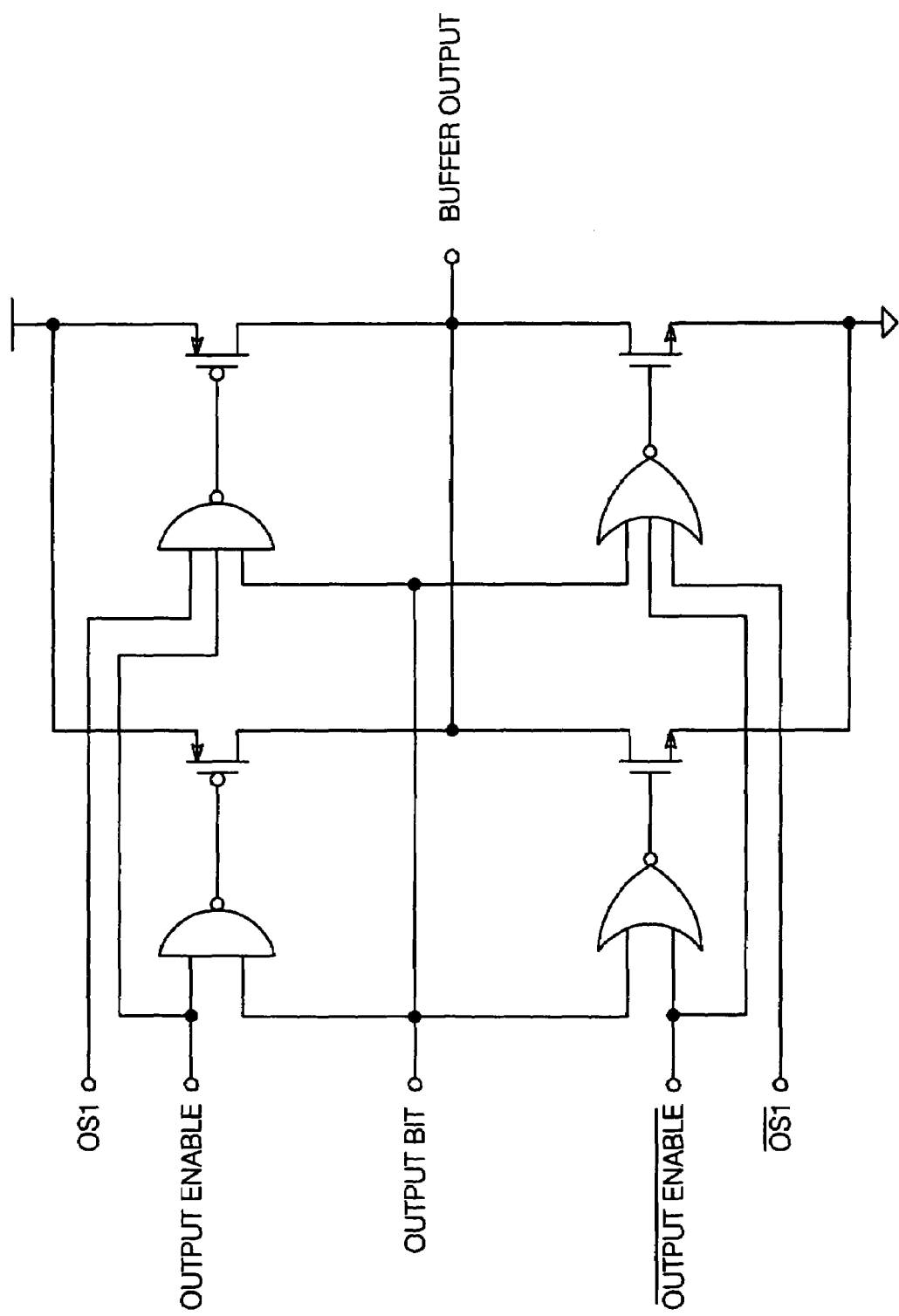
FIG. 5 is a schematic diagram of another possible implementation of a programmable strength output buffer per the present invention.

Another possible embodiment of a programmable strength output buffer is shown in FIG. 5. The circuit of FIG. 4 is susceptible to a large transient short-circuit current, which can occur during the brief interval during which both PMOS and NMOS FETs conduct, as the PMOS FETs turn on and the NMOS FETs turn off, or vice-versa. As this can result in elevated power dissipation and power/ground bounce, this short circuit current may be undesirable. Short circuit current is significantly reduced for the circuit of FIG. 5. As above, the arrangement shown in FIG. 5 would be replicated for each of the output buffer bits. Additional resolution would be achieved by adding additional branches which are responsive to additional output strength control bits.

While particular embodiments of the invention have been shown and described, numerous variations and alternate embodiments will occur to those skilled in the art. Accordingly, it is intended that the invention be limited only in terms of the appended claims.

We claim:

1. A Registered Dual-Inline Memory Module (RDIMM), comprising:
   an address register, said register providing a plurality of output signals which drive respective output lines, at least some of which are connected to the address or control inputs of respective random-access memory (RAM) chips residing on said RDIMM;
   a configuration control signal; and
   an array of programmable strength output buffers within said register which provide respective ones of said output signals, said buffers arranged to receive said configuration control signal and to vary the strength of their respective output signals in response to said configuration control signal;
   wherein said address register includes at least one input for receiving said configuration control signal and said at least one input on said address register comprises JEDEC-specified configuration control bits which are hardwired to logic levels on said RDIMM.

2. The RDIMM of claim 1, wherein said at least one input further comprises additional configuration control bits which are hardwired to logic levels on said RDIMM via redundant address register pins.

3. A Registered Dual-Inline Memory Module (RDIMM), comprising:
   an address register, said register providing a plurality of output signals which drive respective output lines, at least some of which are connected to the address or control inputs of respective random-access memory (RAN) chips residing on said RDIMM;
   a configuration control signal; and
   an array of programmable strength output buffers within said register which provide respective ones of said output signals, said buffers arranged to receive said configuration control signal and to vary the strength of their respective output signals in response to said configuration control signal;
   wherein said configuration control signal is electrically programmed into a memory device that resides on said RDIMM and is provided to said address register via said address register's JEDEC-specified configuration control bits.

4. The RDIMM of claim 3, wherein said configuration control signal is further provided to said address register via redundant address register pins.

5. A Registered Dual-Inline Memory Module (RDIMM), comprising:
   an address register, said register providing a plurality of output signals which drive respective output lines, at least some of which are connected to the address or control inputs of respective random-access memory (RAM) chips residing on said RDIMM;
   a configuration control signal; and
   an array of programmable strength output buffers within said register which provide respective ones of said output signals, said buffers arranged to receive said configuration control signal and to vary the strength of their respective output signals in response to said configuration control signal;
   wherein said configuration control signal is provided by the memory subsystem, and transmitted to said address register via said address register's JEDEC-specified configuration control bits.

6. The RDIMM of claim 5, wherein said configuration control signal is further provided to said address register via redundant address register pins, and in turn to said redundant address register pins through redundant RDIMM connector pins.

7. A Registered Dual-Inline Memory Module (RDIMM), comprising:
   an address register, said register providing a plurality of output signals which drive respective output lines, at least some of which are connected to the address or control inputs of respective random-access memory (RAM) chips residing on said RDIMM;
   a configuration control signal; and
   an array of programmable strength output buffers within said register which provide respective ones of said output signals, said buffers arranged to receive said configuration control signal and to vary the strength of their respective output signals in response to said configuration control signal;
   wherein said address register is configurable for use with different raw cards in response to said configuration control signal.

8. A Registered Dual-Inline Memory Module (RDIMM), comprising:
   an address register, said register providing a plurality of output signals which drive respective output lines, at least some of which are connected to the address or control inputs of respective random-access memory (RAM) chips residing on said RDIMM;
   a configuration control signal; and
   an array of programmable strength output buffers within said register which provide respective ones of said output signals, said buffers arranged to receive said configuration control signal and to vary the strength of their respective output signals in response to said configuration control signal;
   wherein said programmable strength output buffers are arranged such that subsets of said output buffers are programmed to respective strengths in response to said configuration control signal.

9. A Registered Dual-Inline Memory Module (RDIMM), comprising:
   an address register, said register providing a plurality of output signals which drive respective output lines, at least some of which are connected to the address or control inputs of respective random-access memory (RAM) chips residing on said RDIMM;
   a configuration control signal; and
   an array of programmable strength output buffers within said register which provide respective ones of said output signals, said buffers arranged to receive said configuration control signal and to vary the strength of their respective output signals in response to said configuration control signal;

wherein said programmable strength output buffers comprises a first output driver and at least one additional output driver, the outputs of which are summed to provide said buffer's output signal, said additional output drivers enabled and disabled in response to said configuration control signal.

10. The RDIMM of claim 9, wherein the output of each of said output drivers has an associated output current such that the output current of a programmable strength output buffer's output signal is varied in response to said configuration control signal.

11. The RDTMM of claim 9, wherein said configuration control signal comprises a plurality of output strength control bits, said additional output drivers enabled and disabled in response to a respective one of said output strength control bits.

12. The RDIMM of claim 11, wherein each of said programmable strength output buffers receives a respective enable signal and each of said output drivers has an enable input and is enabled and disabled in response to a signal applied to said enable input, said buffer's first output driver enabled and disabled in response to said enable signal and said buffer's additional output drivers enabled and disabled in response to a logical combination of said enable signal and a respective one of said output strength control bits.

13. The RDIMM of claim 9, wherein said configuration control signal comprises a plurality of output strength control bits and said output drivers are enabled and disabled in response to a respective one of said output strength control bits, said RDIMM arranged such that each of said programmable strength output buffers receives the same output strength control bits such that the strengths of the output signals provided by each of said buffers is approximately equal.

14. The RDIMM of claim 9, wherein said configuration control signal comprises a plurality of output strength control bits and said output drivers are enabled and disabled in response to a respective one of said output strength control bits, said output buffers arranged such that each of said programmable strength output buffers receives different output strength control bits such that the strengths of the output signals provided by said buffers are individually programmable.

15. The RDIMM of claim 9, wherein said configuration control signal comprises a plurality of output strength control bits and said output drivers are enabled and disabled in response to a respective one of said output strength control bits, said programmable strength output buffers grouped into subsets each of which receive different output strength control bits, the buffers of each subset receiving the same output strength control bits such that the strengths of the output signals provided by the buffers of said subset are approximately equal.

16. A registered DIMM (RDIMM), comprising:

an address register, said register providing a plurality of output signals which drive respective output lines, at least some of which are connected to the address or control inputs of respective random-access memory (RAM) chips residing on said DIMM;

a plurality of configuration control signals;

an array of programmable strength output buffers within said register which provide said output signals, said buffers and configuration control signals arranged such that subsets of said register's output signals are programmed to respective strengths in response to said configuration control signals.

* * * * *